United States Patent
Namou et al.

(10) Patent No.: US 8,901,934 B2
(45) Date of Patent: Dec. 2, 2014

(54) DIAGNOSIS OF HEV/EV BATTERY DISCONNECT SYSTEM

(75) Inventors: Andrew J. Namou, Southfield, MI (US); Chandra S. Namuduri, Troy, MI (US); Kenneth J. Shoemaker, Highland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 607 days.

(21) Appl. No.: 13/198,340

(22) Filed: Aug. 4, 2011

(65) Prior Publication Data

US 2012/0105065 A1 May 3, 2012

Related U.S. Application Data

(60) Provisional application No. 61/408,490, filed on Oct. 29, 2010.

(51) Int. Cl.
  *G01R 31/327* (2006.01)
  *B60W 20/00* (2006.01)
  *G01R 31/00* (2006.01)

(52) U.S. Cl.
  CPC .......... *G01R 31/3275* (2013.01); *G01R 31/006* (2013.01); *G01R 31/3278* (2013.01)
  USPC ............ 324/415; 324/421; 324/422; 324/423

(58) Field of Classification Search
  None
  See application file for complete search history.

(56) References Cited

U.S. PATENT DOCUMENTS

| | | | | | |
|---|---|---|---|---|---|
| 5,243,336 | A | * | 9/1993 | Noonan et al. | 340/3.8 |
| 5,808,471 | A | * | 9/1998 | Rooke et al. | 324/546 |
| 5,914,849 | A | * | 6/1999 | Perreira | 361/187 |
| 6,023,110 | A | * | 2/2000 | Henrion et al. | 307/125 |
| 2009/0228163 | A1 | * | 9/2009 | Tarchinski | 701/22 |

* cited by examiner

*Primary Examiner* — Melissa Koval
*Assistant Examiner* — Stephen G Armstrong
(74) *Attorney, Agent, or Firm* — John A. Miller; Miller IP Group, PLC

(57) ABSTRACT

A circuit that detects if contacts in an HV contactor have been welded or stuck closed. The circuit includes a controller that generates a short duration pulse signal that closes a driver switch and allows current flow through a coil in the HV contactor. The current flow is converted to a voltage by a sensor, where the voltage is received by the controller. The controller uses the voltage, such as by comparing the voltage to a stored representative voltage of the coil current for when the HV contactor is open, to determine whether the HV contactor is closed, and possibly welded or stuck closed, or partially closed. The sensor can be the driver switch or another device, such as a resistor.

18 Claims, 6 Drawing Sheets

DIAGNOSIS OF HEV/EV BATTERY DISCONNECT SYSTEM

CROSS-REFERENCE TO RELATED APPLICATIONS

This application claims the benefit of the priority date of U.S. Provisional Patent Application Ser. No. 61/408,490, titled HEV/EV Battery Disconnect System Diagnosis of Welded Contactors, filed Oct. 29, 2010.

BACKGROUND OF THE INVENTION

1. Field of the Invention

This invention relates generally to a system and method for determining whether contacts in a high voltage (HV) contactor used in a battery circuit have been welded or stuck closed and, more particularly, to a battery circuit for an electric vehicle (EV) or a hybrid electric vehicle (HEV) that includes circuit components for determining if contacts in an HV contactor used in the circuit have been welded or stuck closed.

2. Discussion of the Related Art

Electric vehicles are becoming more and more prevalent. These vehicles include hybrid vehicles, such as the extended range electric vehicles (EREV) that combine a battery and a main power source, such as an internal combustion engine, fuel cell systems, etc., and electric only vehicles, such as the battery electric vehicles (BEV). All of these types of electric vehicles employ a high voltage battery that includes a number of battery cells. These batteries can be different battery types, such as lithium ion, nickel metal hydride, lead acid, etc. A typical high voltage battery system for an electric vehicle may include a large number of battery cells or modules including several battery cells to meet the vehicle power and energy requirements. The battery system can include individual battery modules where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

The high voltage battery in an electric vehicle is selectively coupled to the vehicle's high voltage bus by HV battery contactors. When the vehicle is shut off, the contactors are opened and the battery is disconnected from the high voltage bus. When the vehicle is switched on, the contactors are closed and the battery voltage is coupled to the high voltage bus.

Battery circuits of the type discussed above typically employ several HV contactors, including the battery disconnect contactors mentioned above, that are capable of operating with high current for the particular application. The contacts in the HV contactors are typically held normally open by a spring where a coil in the HV contactor is energized to move the contacts against the bias of the spring to close the HV contactor. Because of the high current that is passing through the HV contactor, it is possible that the contacts that make the connection in the HV contactor when the HV contactor is closed will arc possibly causing the contacts to essentially weld together, where the contacts remain closed and an electrical connection through the HV contactor is still made after the coil is de-energized and the HV contactor should otherwise be opened by the spring. Also, this welding could cause a partial closing of the HV contactor where a high resistance across the contactor occurs.

The designers of battery circuits for these high voltage applications consider this problem and provide suitable design features so that an HV contactor that is welded or stuck closed is not likely to be a safety concern. However, such stuck closed HV contactors could still provide high voltage to unwanted parts of the circuit at unwanted times. Algorithms and processes may be employed to detect a welded or stuck HV contactor. These processes typically use the sequencing of the switches to identify a welded or stuck closed HV contactor, where if a high voltage is detected at a location where it shouldn't be, a welded or stuck closed contact may be suspected. If such a welded or stuck closed HV contactor is detected, then the algorithms may provide suitable warnings to the vehicle driver that service is required. Further, because the vehicle battery industry is moving towards lithium-ion batteries, which are desirable because they typically provide a higher performance because of a higher current density than other battery types, the welding problem of the HV contactor contacts increases with these types of batteries.

The above described technique of detecting welded or stuck closed contacts in an HV contactor has various disadvantages including the time factor involved in going through the sequence of opening and closing the HV contactors, measuring the voltage, and determining that an HV contactor is welded or stuck closed. Further, when using this process of sequencing to determine welded or stuck closed contacts, it is typically not possible to determine if the first HV contactor that is closed during vehicle or system start-up is welded or stuck closed.

SUMMARY OF THE INVENTION

In accordance with the teachings of the present invention, a detection circuit suitable for an EV/HEV is disclosed that detects if contacts in an HV contactor have been welded or stuck closed. The circuit includes a controller that generates a short duration pulse signal that closes a driver switch and allows current flow through a coil in the HV contactor. The current flow is converted to a voltage by a sensor, where the voltage is received by the controller. The controller uses the voltage, such as by comparing the voltage to a stored representative voltage of the coil current for when the HV contactor is open, to determine whether the HV contactor is possibly welded or stuck closed, or partially closed. The sensor can be the driver switch or another device, such as a resistor, Hall-effect current sensor, magneto-restrictive current sensor, etc.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a contact weld or stuck condition detection circuit is merely exemplary in nature, and is in no way intended to limit the invention or its application or uses. For example, the contact weld or stuck closed condition detection circuit of the invention is described herein as being for a battery circuit in an electric vehicle. However, as will be appreciated by those skilled in the art, the circuit may be applicable for other applications.

Figure 1:
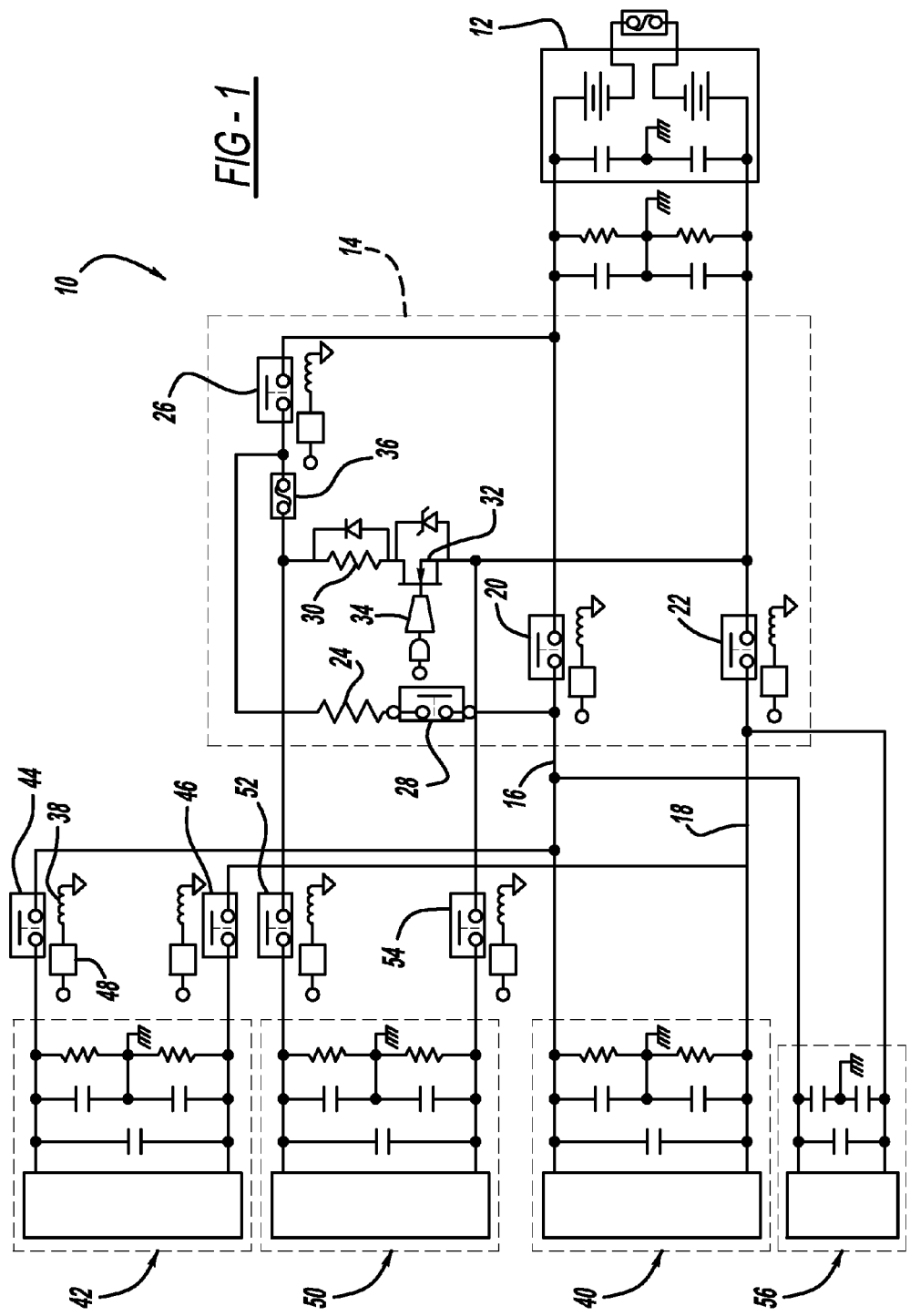
FIG. 1 is a schematic diagram of a battery circuit for an electric vehicle.

FIG. 1 is a schematic diagram of a battery circuit 10 including a battery 12 and a battery disconnect unit (BDU) 14 for an electric vehicle. The battery 12 can be any battery suitable for the purposes described herein, such as a nickel metal hydride battery, a lithium-ion battery, a lead-acid battery, etc. The battery 12 includes a plurality of battery cells electrically coupled in series and/or in parallel to provide the desired high voltage for a particular application. The battery 12 is electrically coupled to a high voltage bus including a positive bus line 16 and a negative bus line 18. Various high voltage components and circuits are electrically coupled to the bus lines 16 and 18, some of which are discussed below, for the particular application. The electrical components that are coupled to the high voltage bus lines 16 and 18 typically include capacitors that filter bus noise and ripple currents generated by the components themselves, as is well understood by those skilled in the art.

A main positive battery HV contactor 20 is provided in the positive bus line 16, and a main negative HV contactor 22 is provided in the negative bus line 18, where the HV contactors 20 and 22 selectively connect and disconnect the battery 12 to the high voltage bus on the vehicle in a manner that is well understood by those skilled in the art. The battery circuit 10 also includes a pre-charge resistor 24 electrically coupled to the positive bus line 16 in a manner that allows it to by-pass the HV contactor 20 when a multipurpose HV contactor 26 and a pre-charge HV contactor 28 are closed. The pre-charge resistor 24 limits the charging current at system start-up of the various capacitors across the bus lines 16 and 18 to prevent damage to the capacitors, the contactors, and other electrical components in a manner that is well understood by those skilled in the art.

Battery circuits of the type described herein typically are used in combination with thermal management systems that control the temperature of the battery 12 so that it operates at a desirable temperature for better performance. The circuit 10 includes a resistive electric heater 30 for this purpose that is electrically coupled to across the bus lines 16 and 18 when the multipurpose HV contactor 26 is closed. The heater 30 would typically have a significantly higher resistance than the pre-charge resistor 24. An FET switch 32 selectively turns on the heater 30 when it receives a signal at its gate terminal to close the switch 32 through a suitable high voltage isolation circuit 34, as is well understood by those skilled in the art. A fuse 36 provides over current protection for the battery circuit elements.

The circuit 10 includes a traction power inverter module (TPIM) 40 that couples the high voltage on the bus lines 16 and 18 to an AC traction motor (not shown). The circuit 10 also includes a fast charger circuit 42 that does not reside on the vehicle, but provides a fast charge high current for charging the battery 12. The fast charger circuit 42 includes HV contactors 44 and 46 that electrically connect and disconnect the fast charger circuit 42 to the bus lines 16 and 18, respectively. The circuit 10 also includes a slow charger circuit 50 that does reside on the vehicle and provides a low current trickle charge for charging the battery 12. The slow charger circuit 50 also includes HV contactors 52 and 54 that electrically couple and disconnect the slow charger circuit 50 to the bus lines 16 and 18, respectively. The circuit 10 also includes an auxiliary power module 56 that operates as a DC/DC converter for down converting the high voltage from the battery 12, and is electrically coupled to the bus lines 16 and 18. The circuit 10 may include other modules and circuits for other vehicle applications, such as a high voltage AC compressor module (not shown) and a cabin heater control module (not shown) that provides heat to the cabin if the vehicle is an electric only vehicle, both well known to those skilled in the art.

In the circuit 10, each of the HV contactors 20, 22, 26, 28, 44, 46, 52 and 54 are normally open switches that include a coil 38 that is energized to close the HV contactor. As will be discussed in detail below, a contact weld detection circuit 48 is electrically coupled to the coil 38 to determine whether the particular HV contactor in the circuit 10 is welded or stuck closed. The electric vehicle on which the circuit 10 is provided can have a telematic system that can be remotely activated to determine the state of health of a high voltage battery disconnect system for the battery 12 and alert a vehicle driver of a detected closed condition of an HV contactor.

Figure 2:
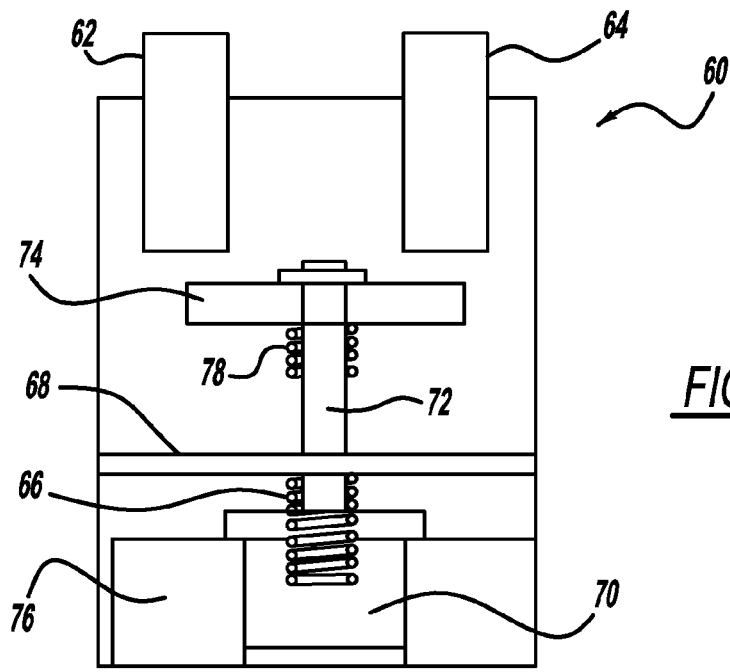
FIG. 2 is a side plan view of an HV contactor that can be used within the circuit shown on FIG. 1.

FIG. 2 is a cross-sectional plan view of an HV contactor 60 of the type that can be employed in the circuit 10 and including stationary contacts 62 and 64. It is stressed that the HV contactor 60 is merely representative of HV contactors generally in that many other HV contactor designs are known that are applicable to the discussion herein. A spring 66 is positioned between a plate 68 and a flux member 70. The flux member 70 is attached to one end of a shaft 72 and a contact plate 74 is attached to an opposite end of the shaft 72 and is spaced from the contacts 62 and 64 when the HV contactor 60 is open. Providing a current to a coil 76 causes the flux member 70 to rise against the bias of the spring 66 so that the contact plate 74 pushes up and contacts the contacts 62 and 64 making an electrical connection therebetween. A spring 78 cushions the plate 74 when making contact with the contacts 62 and 64. When the HV contactor 60 is welded in the closed position, the contact plate 74 is welded to one or both of the contacts 62 and 64 so that when the current is removed from the coil 76 the bias of the spring 66 is not sufficient to cause the plate 74 to fully separate from the contacts 62 and 64. The contact plate could be stuck in the closed position due to other mechanical failures or debris.

It can be shown that the position of the flux member 70 and the shaft 72 provide a unique current to voltage response of the coil current. Thus, if the contact plate 74 is welded to one or both of the contacts 62 and 64, the shaft's position would be at or near a closed position, and thus, the coil 74 would produce a current to voltage response similar to that of a fully seated, but un-welded switch. The language used herein concerning welded closed, stuck closed, welded shut, stuck shut, etc. refers to any configuration or orientation where the contacts 62 and 64 are stuck closed including a full weld condition where electrical contact through the contactor 60 is still made or a partial weld of the contacts 62 and 64 where the contacts 62 and 64 aren't completely closed, and provide a high resistance.

When the vehicle is started, the various HV contactors in the circuit 10 are opened and closed in a predetermined sequence to provide a desired start-up sequence. For example, the main negative HV contactor 22 is closed first, and the pre-charge HV contactor 28 is closed next, which causes the various capacitors and modules described above to be energized at a slower rate than might otherwise occur if the main positive HV contactor 20 is closed prior to the pre-charge HV contactor 28. Next, the main positive HV contactor 20 is closed and then the pre-charge HV contactor 28 is opened. In this sequence, the pre-charge current rises when the pre-charge HV contactor 28 is closed and the high voltage bus voltage begins to rise. If the pre-charge HV contactor 28 is welded or stuck shut, then the pre-charge current comes up immediately when the main negative HV contactor 22 is closed, which can be detected to indicate that the HV contactor 28 is welded or stuck closed. However, for the reasons described above, it would be desirable to know that the pre-charge HV contactor 28, and other HV contactors, was welded or stuck closed prior to initiating the start-up sequence.

Figure 3:
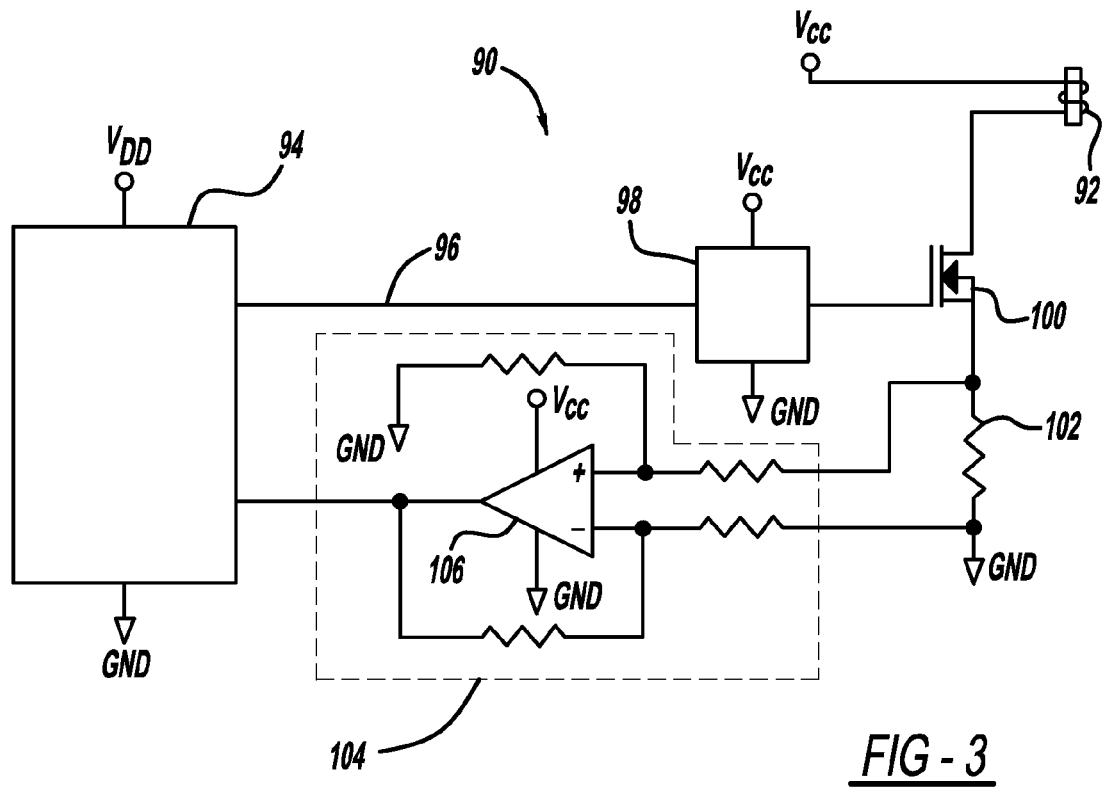
FIG. 3 is a schematic diagram of a contact weld detection circuit that can be used in combination with the battery circuit shown in FIG. 1, where the circuit is electrically coupled to a low side of the coil.

FIG. 3 is a schematic diagram of a contact weld detection circuit 90 that shows one possible embodiment for determining whether one of the HV contactors in the circuit 10 is welded or stuck closed, which could be one of the detection circuits 48 in the battery circuit 10. The circuit 90 is electrically coupled to a high side or source side of a coil 92, where the coil 92 represents the coil 38 within the particular HV contactor being tested. The coil 92 is shown coupled to a low voltage electrical potential Vcc, such as 12 V, that is the potential used to normally energize the coil 92 to close the HV contactor. An electronic controller 94 provides a signal on line 96 to a gate driver circuit 98 operating as a controller for controlling a signal applied to the gate of a driver switch 100 to close the switch 100 during normal operation and when the HV contactor is being tested to determine if the HV contactor is welded shut, as being discussed herein. In one non-limiting embodiment, the driver switch 100 is a MOSFET switch, although other types of switches can be employed as would be well understood by those skilled in the art. The circuit 90 includes the single gate driver circuit 98 for the single coil 92. However, in other embodiments, the controller 94 may control a gate driver circuit for every HV contactor in the circuit 10. It is also possible that the driver circuit 98 is integrated within the electronic controller 94 or the switch 100.

The signal from the electronic controller 94 and the gate driver circuit 98 for testing the HV contactor is typically a square pulse signal of a very limited duration, for example, 10 ms, that is not enough time to cause the coil 92 to close the HV contactor if it is not welded closed, but is enough time to generate a measurable current signal from the coil 92. When the coil 92 is energized, it generates a current that flows through the switch 100 and through a sensing resistor 102 to ground during the pulse signal. Lines are coupled across the sensing resistor 102 to provide a voltage potential representative of the current flow therethrough. The voltage generated across the sensing resistor 102 is applied to a buffer or amplifier circuit 104 including an operational amplifier 106. In this embodiment, the amplifier circuit 104 has a gain that amplifies the voltage across the sensing resistor 102, which is provided as an input to the controller 94, where it is converted to a digital signal by an analog-to-digital converter. The digital signal is then used to determine whether the HV contactor associated with the coil 92 is closed, which would indicate that it is welded shut. Alternate embodiments of the coil driver arrangement may use the switch 100 on the high side of the coil 92 and the sensing resistor 102 on the high side or low side of the coil 92.

Figure 4:
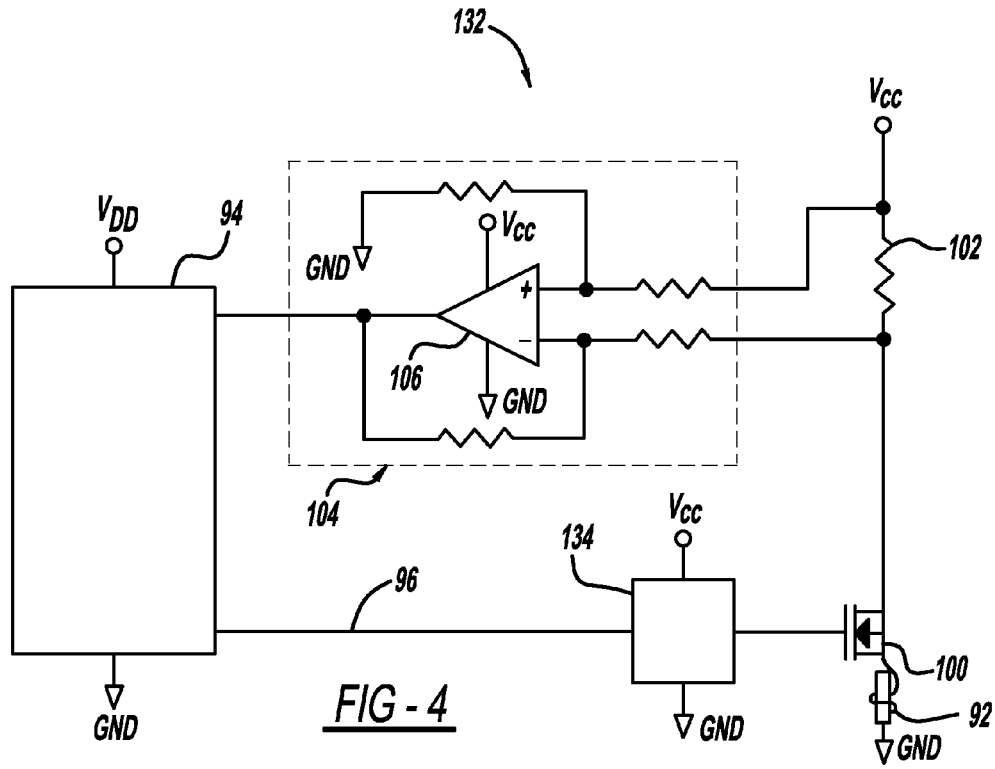
FIG. 4 is a schematic diagram of a contact weld detection circuit that can be used in combination with the battery circuit shown in FIG. 1, where the circuit is electrically coupled to a high side of the coil.

FIG. 4 is a schematic diagram of a contact weld detection circuit 132 that uses the sensing resistor 102, similar to the detection circuit 90, where like elements are identified by the same reference number, that shows another possible embodiment for determining whether one of the HV contactors in the circuit 10 is welded or stuck closed, which could be one of the detection circuits 48. In this embodiment, the circuit 132 is electrically coupled to a low side or ground side of the coil 92. The circuit 132 includes a gate driver circuit 134 that is slightly different than the driver circuit 98 for the different voltage potential.

Figure 5:
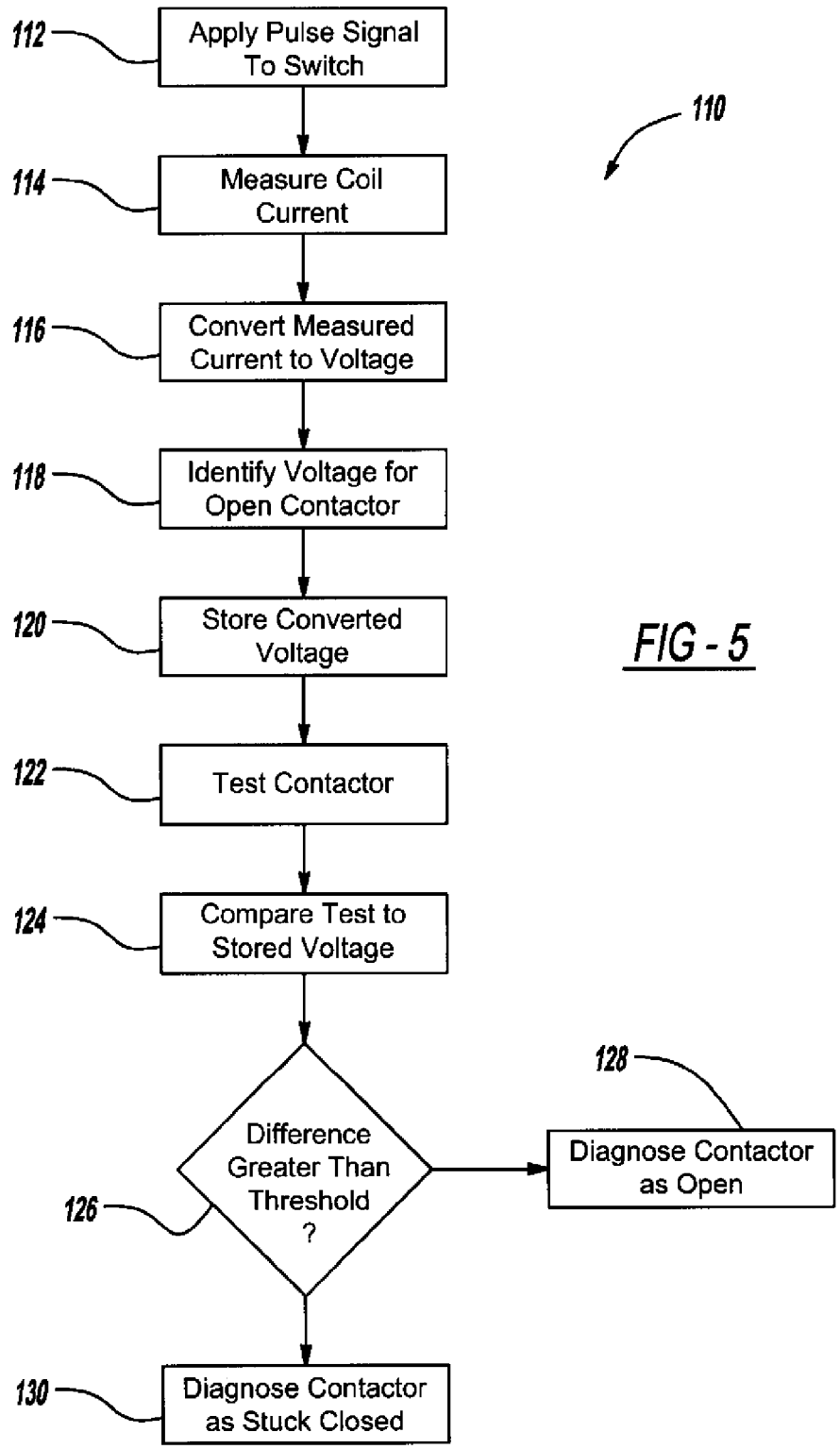
FIG. 5 is a flow chart diagram describing an operation of the weld detection circuit shown in FIG. 3.

FIG. 5 is a flow chart diagram 110 showing an algorithm for one operation to determine whether a particular HV contactor being tested is welded shut that uses, for example, the circuit 90. First, the algorithm generates a table off-line that is stored on the vehicle and includes values that identify the coil current in response to a pulse signal for an HV contactor that is open. A value identifying the coil current for an open HV contactor is stored for each HV contactor in the battery circuit 10 that is desired to be tested. The stored value can then be compared to the measured current of the particular coil to determine if the HV contactor contacts are welded shut during vehicle operation.

At box 112, for the off-line table generation, the electronic controller 94 causes the gate driver circuit 98 to apply a pulse signal to the base terminal of the switch 100 for a predetermined duration, such as 10 ms. The time of the pulse is typically set for the analog-to-digital conversion efficiency of the controller 94, and will be a small enough duration where the HV contactor does not close. This time period needs to be smaller than what would be required to close the HV contactor so that if the HV contactor is not welded shut, it will not close under the signal applied to the coil 92 during the test. Thus, if the HV contactor is not welded closed, the measured voltage will be for a coil current where the HV contactor is known to be open. The current provided by the coil 92 during the voltage pulse generates a potential across the resistor 102 so that the coil current can be measured at predetermined time intervals at box 114. At box 116, the current flowing through the resistor 102 is conditioned to generate a suitable voltage, such as 10 V/A, using the amplifier 104. At box 118, the voltage for the normally open HV contactor is identified in the controller 94 from the conditioned signal from the amplifier 104 during the pulse signal. At box 120, the value of the digitally converted voltage measurement signal during the pulse signal is stored for each of the HV contactors in the circuit 10, which will later be used during vehicle operation to determine if the HV contactor is closed when it should be open.

Once the values are stored in the electronic controller 94, then the HV contactor can be tested in the manner as discussed above during operation of the vehicle at box 122. In one embodiment, each high voltage HV contactor in the circuit 10 is determined to be welded or stuck shut, or not, at key-on of the vehicle. However, the test for determining contactor welding can be performed at any desirable time, including through telematic diagnostics. The digital value that is generated in the electronic controller 94 in response to the voltage conversion of the coil current through the resistor 102 is compared to the stored digital value in the table for that particular HV contactor at box 124. The algorithm determines whether the difference between the above two digital values in the electronic controller 94 exceeds a predetermined threshold at decision diamond 126. If the difference between the digital values does not exceed the threshold, then the contacts in the particular HV contactor being tested are diagnosed to be opened, and not welded shut at box 128. If, however, the difference between the digital signals does exceed the threshold at the decision diamond 126, then the HV contactor is likely closed, and diagnosed to be welded or stuck closed, at box 130.

Figure 6:
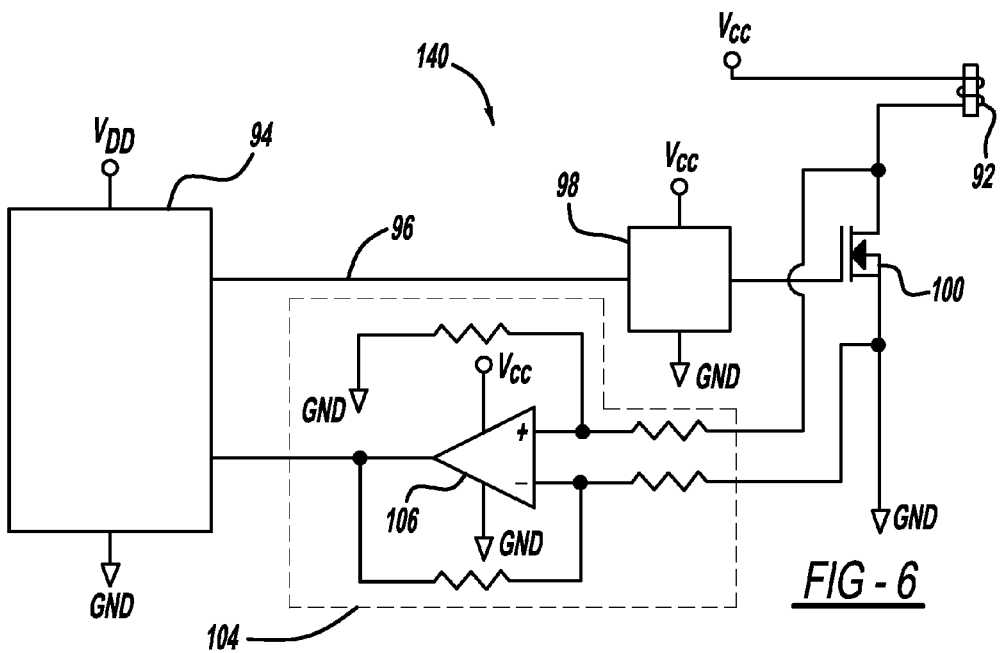
FIG. 6 is a schematic diagram of another contact weld detection circuit that can be used in combination with the battery circuit shown in FIG. 1, where the circuit is electrically coupled to a low side of the coil.

In an alternate embodiment, the sensing resistor 102 in the detection circuit 90 can be eliminated, and the switch 100 can be used as a sensing device across which the voltage can be calibrated in response to the current from the coil 92. FIG. 6 is a schematic diagram of a detection circuit 140, similar to the circuit 90, where like elements are identified by same reference numeral, showing this embodiment. The circuit 140 is electrically coupled to a high side or source side of the coil 92. As is apparent, the sensing resistor 102 has been eliminated and the lines connected to the amplifier circuit 104 are coupled across the switch 100. The amplified voltage drop across the switch 100 is sampled by the electronic controller 94 using an analog-to-digital converter during the time that the switch 100 is briefly turned on by the pulse signal to determine the contactor condition. Ambient temperature is used to adjust the switch on-voltage with respect to the initial calibration value that detects the contact weld condition.

Figure 7:
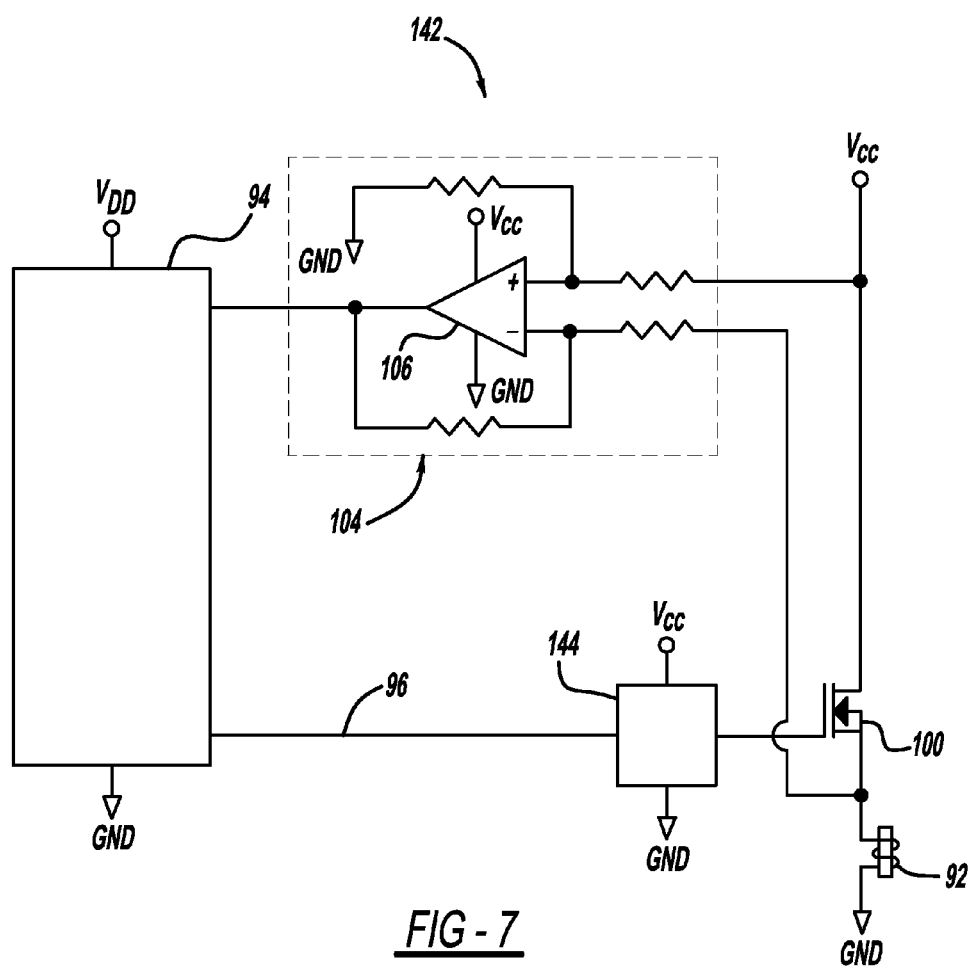
FIG. 7 is a schematic diagram of another contact weld detection circuit that can be used in combination with the battery circuit shown in FIG. 1, where the circuit is electrically coupled to a high side of the coil.

FIG. 7 is a schematic diagram of a detection circuit 142, similar to the circuit 140, where like elements are identified by the same reference number, that shows another possible embodiment for determining whether one of the HV contactors in the circuit 10 is welded or stuck closed by using the switch 100 as a sensing device. In this embodiment, the circuit 142 is electrically coupled to a low side or ground side of the coil 92.

Figure 8:
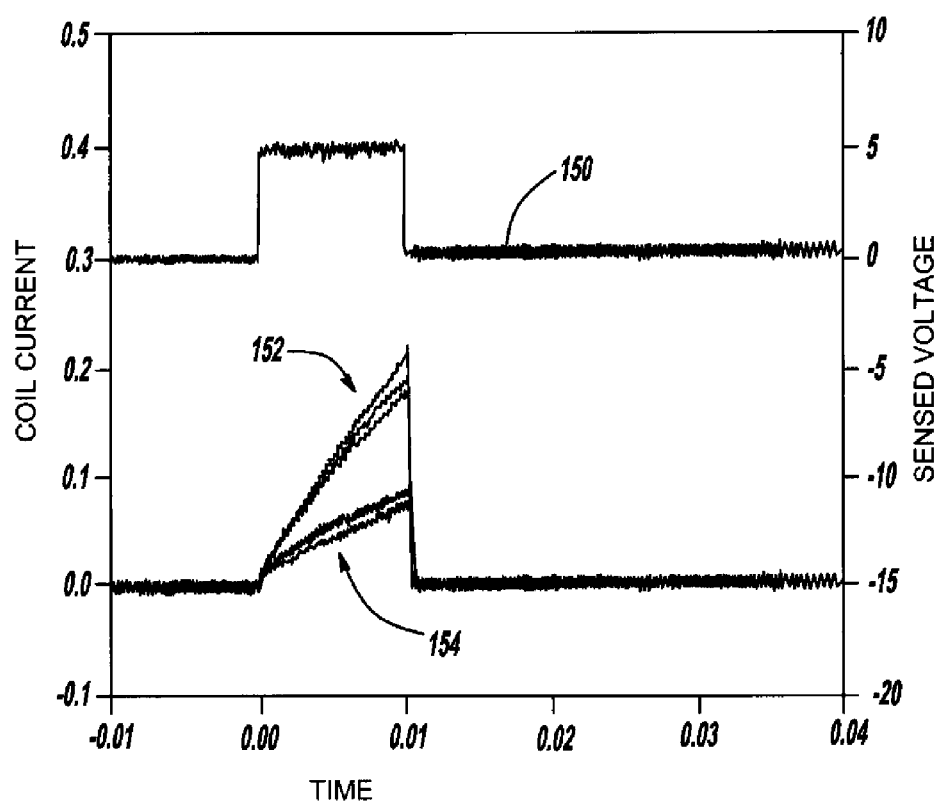
FIG. 8 is a graph showing pulse duration time and contact or response.

FIG. 8 is a graph with time on the horizontal axis and coil current on the left vertical axis showing the difference between the coil current response for the pulse signal for normal contacts and contacts that are welded or stuck closed. A square pulse of 10 ms is provided at line 150 between 0.00 and 0.01 seconds. Six tests were performed at three different temperatures where the group of graph lines 152 shows the current response of the coil in the HV contactor at the temperatures −40° C., 25° C. and 85° C. for contacts that are not welded or stuck closed and the group of graph lines 154 shows the coil current response for contacts that are welded or stuck closed at the temperatures of −40° C., 25° C. and 85° C. As is apparent, there is a significant difference in the coil current magnitude between an open HV contactor and a closed, possibly welded, HV contactor.

The invention contemplates any suitable technique for determining whether the contacts in the HV contactor are closed based on the sensed voltage signal. The discussion above determines whether the contacts are welded or stuck closed based on the magnitude of the coil current. In an alternate embodiment, the rise of the coil current during the pulse signal can be used instead of the magnitude, which would give an indication of whether the contacts are welded or stuck closed if the current reached a predetermined threshold value within a predetermined period of time. This is evidenced by the slope of the curves of the graph lines 152 and 154. Other techniques include determining the differential of the current rate, determining the differential of the voltage rate, integration of the current, integration of the voltage and integration of the power.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A detection circuit for determining whether contacts in a high voltage (HV) contactor are stuck closed, said detection circuit comprising:
a power source electrically coupled to a coil in the HV contactor;
a driver switch electrically coupled to the coil in the HV contactor;
a sensor electrically coupled to the coil in the HV contactor;
a buffer including inputs electrically coupled across the sensor, said buffer providing a voltage signal indicative of a current flow through the sensor; and
a controller configured to determine whether the contacts in the HV contactor are welded closed, said controller providing a pulse signal to the driver switch that causes a current flow through the coil for a time period less than the time necessary to close the HV contactor, said controller receiving a voltage signal from the buffer that identifies the current flow through the sensor during the pulse signal to determine whether the contacts are welded or stuck closed, where the controller compares the voltage signal from the buffer to a stored signal identifying an open HV contactor to determine whether the contacts are welded closed, including comparing a differential of the voltage signal from the buffer to a differential of the stored signal and comparing an integral of the voltage signal from the buffer to an integral of the stored signal.

2. The detection circuit according to claim 1 wherein the sensor is the driver switch.

3. The detection circuit according to claim 1 wherein the sensor is a resistor electrically coupled to the driver switch.

4. The detection circuit according to claim 1 wherein the controller determines how fast the voltage signal from the buffer rises during the pulse signal to determine whether the contacts are welded closed.

5. The detection circuit according to claim 1 wherein the HV contactor is part of a battery circuit that controls a high voltage battery.

6. The detection circuit according to claim 5 wherein the battery circuit is on an electric vehicle.

7. The detection circuit according to claim 6 wherein the electric vehicle has a telematic system that can be remotely activated to determine the state of health of a high voltage battery disconnect system on the vehicle and alert a vehicle driver of a detected closed condition of the HV contactor.

8. The detection circuit according to claim 1 wherein the driver switch is a MOSFET switch.

9. The detection circuit according to claim 1 wherein the buffer is a buffer amplifier that amplifies the voltage signal.

10. The detection circuit according to claim 1 wherein the pulse signal has a duration in the range of 1-20 ms.

11. An electric vehicle including a battery electrically coupled to a battery control circuit, said battery control circuit including at least one detection circuit for determining whether contacts in a high voltage (HV) contactor are closed, said HV contactor being part of the battery control circuit, said electric vehicle comprising:
 a power source electrically coupled to a coil in the HV contactor; and
 a controller configured to determine whether the contacts in the HV contactor are closed, said controller causing a current flow through the coil for a time period less than the time necessary to close the HV contactor, said controller receiving a voltage signal that identifies the current flow to determine whether the contacts are closed, where the controller compares the voltage signal to a stored signal identifying an open HV contactor to determine whether the contacts are welded closed, including comparing a differential of the voltage signal to a differential of the stored signal and comparing an integral of the voltage signal to an integral of the stored signal.

12. The electric vehicle according to claim 11 further comprising a sensor that receives the current flow from the coil, said sensor providing the voltage signal indicative of the current flow.

13. The electric vehicle according to claim 11 further comprising a driver switch, wherein the controller causes the current flow through the coil by applying a pulse signal to the driver switch electrically coupled to the coil.

14. The electric vehicle according to claim 11 further comprising an amplifier, said amplifier amplifying the voltage signal before it is provided to the controller.

15. A method for determining whether contacts in a high voltage (HV) contactor are stuck closed, said method comprising:
 applying a pulse signal to a coil in the HV contactor for a duration that allows the coil to generate a current flow, but is not long enough for the pulse signal to close the HV contactor;
 converting a current from the coil to a voltage signal; and
 analyzing the voltage signal to determine whether it indicates that the HV contactor is open or closed, including comparing the voltage signal to a stored signal that indicates that the HV contactor is open, and further including comparing a differential of the voltage signal to a differential of the stored signal and comparing an integral of the voltage signal to an integral of the stored signal.

16. The method according to claim 15 wherein analyzing the voltage signal includes determining how fast the voltage signal rises when the pulse signal is being applied to determine whether the HV contactor is open or closed.

17. The method according to claim 15 further comprising amplifying the voltage signal prior to analyzing the voltage signal.

18. The method according to claim 15 wherein the HV contactor is part of a battery circuit that controls a high voltage battery on a vehicle.

* * * * *